(12) United States Patent
Coss, Jr. et al.

(10) Patent No.: US 6,960,774 B2
(45) Date of Patent: Nov. 1, 2005

(54) FAULT DETECTION AND CONTROL METHODOLOGIES FOR ION IMPLANTATION PROCESSES, AND SYSTEM FOR PERFORMING SAME

(75) Inventors: Elfido Coss, Jr., Austin, TX (US); Patrick M. Cowan, Pflugerville, TX (US); Richard J. Markle, Austin, TX (US); Tom Tse, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 141 days.

(21) Appl. No.: 10/700,175

(22) Filed: Nov. 3, 2003

(65) Prior Publication Data

US 2005/0092939 A1  May 5, 2005

(51) Int. Cl.$^7$ ..................... H01J 37/304; H01J 37/317
(52) U.S. Cl. ............................ 250/492.21; 250/492.2; 250/492.22; 438/10; 700/121; 257/E21.001
(58) Field of Search ........................ 250/492.21, 492.2, 250/492.22; 438/10; 700/121; 257/E21.001

(56) References Cited

U.S. PATENT DOCUMENTS

| | | | | |
|---|---|---|---|---|
| 6,055,460 A | | 4/2000 | Shopbell | 700/121 |
| 6,465,263 B1 * | | 10/2002 | Coss et al. | 438/14 |
| 6,823,231 B1 * | | 11/2004 | Bode et al. | 700/121 |
| 2002/0055801 A1 | | 5/2002 | Reiss et al. | 700/111 |
| 2003/0042427 A1 | | 3/2003 | Sullivan et al. | 250/397 |
| 2004/0102857 A1 * | | 5/2004 | Markle et al. | 700/2 |

OTHER PUBLICATIONS

PCT Search Report from PCT/US2004/017617, dated Dec. 2, 2004.
Rendon et al., "Ion Implant Data Log Analysis for Process Control and Fault Detection," *IEEE*, pp. 331–334, 2002.

* cited by examiner

*Primary Examiner*—Nikita Wells
(74) *Attorney, Agent, or Firm*—Williams, Morgan & Amerson

(57) ABSTRACT

The present invention is generally directed to fault detection and control methodologies for ion implant processes, and a system for performing same. In one illustrative embodiment, the method comprises performing a tuning process for an ion implant tool, the tuning process resulting in at least one tool parameter for the ion implant tool, selecting or creating a fault detection model for an ion implant process to be performed in the ion implant tool based upon the tool parameter resulting from the tuning process, and monitoring an ion implant process performed in the ion implant tool using the selected or created fault detection model. In another illustrative embodiment, the method comprises performing a tuning process for an ion implant tool, the tuning process resulting in at least one tool parameter for the ion implant tool, and determining if the tool parameter resulting from the tuning process is acceptable based on historical metrology data for implant regions formed in at least one substrate subjected to an ion implant process performed in the ion implant tool.

45 Claims, 3 Drawing Sheets

FAULT DETECTION AND CONTROL METHODOLOGIES FOR ION IMPLANTATION PROCESSES, AND SYSTEM FOR PERFORMING SAME

BACKGROUND OF THE INVENTION

1. Field of the Invention

This invention relates generally to the field of semiconductor device manufacturing and, more particularly, to fault detection and control methodologies for ion implantation processes, and a system for performing same.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of process tools, including photolithography steppers, etch tools, deposition tools, polishing tools, rapid thermal process tools, implantation tools, etc. The technologies underlying semi-conductor process tools have attracted increased attention over the last several years, resulting in substantial refinements. However, despite the advances made in this area, many of the process tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can result in non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various process tools. The manufacturing tools communicate with a manufacturing frame-work or a network of processing modules. Each manufacturing tool is generally connected to an equipment interface. The equipment interface is connected to a machine interface that facilitates communications between the manufacturing tool and the manufacturing frame-work. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device. Various tools in the processing line are controlled in accordance with performance models to reduce processing variation. Commonly controlled tools include photolithography steppers, ion implant tools, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

Ion implantation is a very complex and widely used process in the manufacture of integrated circuit devices. Ion implantation is a technique used to implant a dopant material, e.g., arsenic or boron, into a structure, e.g., a substrate, to form very precise implant regions having a certain dopant concentration and profile. Ion implantation processes may also be performed to implant dopant materials into a layer of material. Very precise control of ion implantation processes is desirable because of the impact the implant regions may have on the performance capabilities of the ultimate integrated circuit product. For example, precise control of the ion implantation processes performed to form the source/drain regions for a transistor or to control the threshold voltage of the transistor is required if the ultimate devices are to operate as intended.

Typically, in modern semiconductor manufacturing facilities, ion implantation processes are performed on a group or batch of substrates, e.g., wafers. The number of substrates processed in each batch may vary depending on the ion implant equipment used to perform the process. Most of the batch-type ion implant equipment may perform the ion implant process on 13 or 17 wafers at a time. There is great interest in attempting to insure that the processes performed in such ion implant tools are performed correctly. Moreover, in some cases, if the ion implant processes are performed incorrectly, the substrates subjected to such incorrect processes must be destroyed. That is, it is very difficult, if not impossible, to rework substrates subjected to erroneous ion implant processes.

In an effort to control ion implant processes, metrology data is taken after the ion implantation process is performed to determine whether the process has performed acceptably. Such metrology data may be acquired from production or test wafers. For example, TP420 and/or TP500 model metrology tools manufactured by Thermawave may be used to determine crystal lattice problems. As another example, a Prometrix model number RS55 metrology tool may be used on test wafers to determine the dopant concentration profile of implanted regions after the implant process is performed. In some cases, the metrology data may be acquired using a secondary ion mass spectrometry (SIMS) tool made by Cameca on test wafers. However, such processes may take a relatively long time, e.g., for sheet resistance data, the process may take approximately 10 minutes per substrate to perform such metrology tests. Moreover, such metrology tests are typically not performed until well after the implantation process has been completed, e.g., hours or days after the ion implantation process is finished. As a result, the metrology data is not provided in as timely a fashion as would otherwise be desired. For example, during the period when metrology data is being obtained, additional substrates may be processed in the ion implant tool using tool parameters that are producing implant regions of an undesirable quality.

As stated previously, ion implantation processes are very complex, and the successful performance of such ion implantation processes depends on a number of related parameters of the process, e.g., implant dose, implant energy level, gas flow rates, the current and voltage levels of the filament, ion beam current, number of scans, etc. To achieve a desired to targeted result, modem ion implant equipment may automatically adjust or tune the ion beam prior to performing an implant process in an effort to insure that the implant process performed by the tool will produce acceptable results. That is, the ion implant tool attempts to tune or adjust a plurality of these related parameters such that a selected combination of these parameters will produce the intended results. The tuning process is a relatively time-consuming process. This internal tuning is typically accomplished by directing the ion implant beam at a Faraday cup within the implant tool and varying one or more of the tool parameters. Unfortunately, as target conditions or values change, as new ion implant recipes are performed and/or as the volume of substrates processed by a tool mounts, the process may become less stable, thereby potentially introducing errors into the ion implant process. As a result, the resulting implant regions, and the devices comprised of such implant regions, may be less than desirable in terms of performance.

Moreover, the tuning process described above is typically performed whenever the ion implant tool is to perform a new implant recipe. Given the vast number of tool parameters that may be varied to achieve the targeted implant region and process, the tuning process may produce a vast number of combinations of such parameters, even though the target implant region and process are the same. As a result, effective monitoring of such ion implant tools and processes are difficult.

What is desired are systems and methods that enable effective monitoring and control of ion implant tools and processes in a timely manner. The present invention is directed to methods and systems that may solve, or at least reduce, some or all of the aforementioned problems.

SUMMARY OF THE INVENTION

The present invention is generally directed to fault detection and control methodologies for ion implant processes, and a system for performing same. In one illustrative embodiment, the method comprises performing a tuning process for an ion implant tool, the tuning process resulting in at least one tool parameter for the ion implant tool, selecting a fault detection model for an ion implant process to be performed in the ion implant tool based upon the tool parameter resulting from the tuning process, and monitoring an ion implant process performed in the ion implant tool using the selected fault detection model.

In another illustrative embodiment, the method comprises performing a tuning process for an ion implant tool, the tuning process resulting in at least one tool parameter for the ion implant tool, creating a fault detection model for an ion implant process to be performed in the ion implant tool based upon the tool parameter resulting from the tuning process, and monitoring an ion implant process performed in the ion implant tool using the created fault detection model.

In yet another illustrative embodiment, the method comprises performing a tuning process for an ion implant tool, the tuning process resulting in at least one tool parameter for the ion implant tool, and determining if the tool parameter resulting from the tuning process is acceptable based on historical metrology data for implant regions formed in at least one substrate subjected to an ion implant process performed in the ion implant tool.

In a further illustrative embodiment, the method comprises performing a tuning process for an ion implant tool, the tuning process resulting in at least one tool parameter for the ion implant tool, and determining if the tool parameter resulting from the tuning process is acceptable based on a comparison of the tool parameter with a collection of tuning setpoint models.

BRIEF DESCRIPTION OF THE DRAWINGS

The invention may be understood by reference to the following description taken in conjunction with the accompanying drawings, in which like reference numerals identify like elements, and in which.

Figure 1:
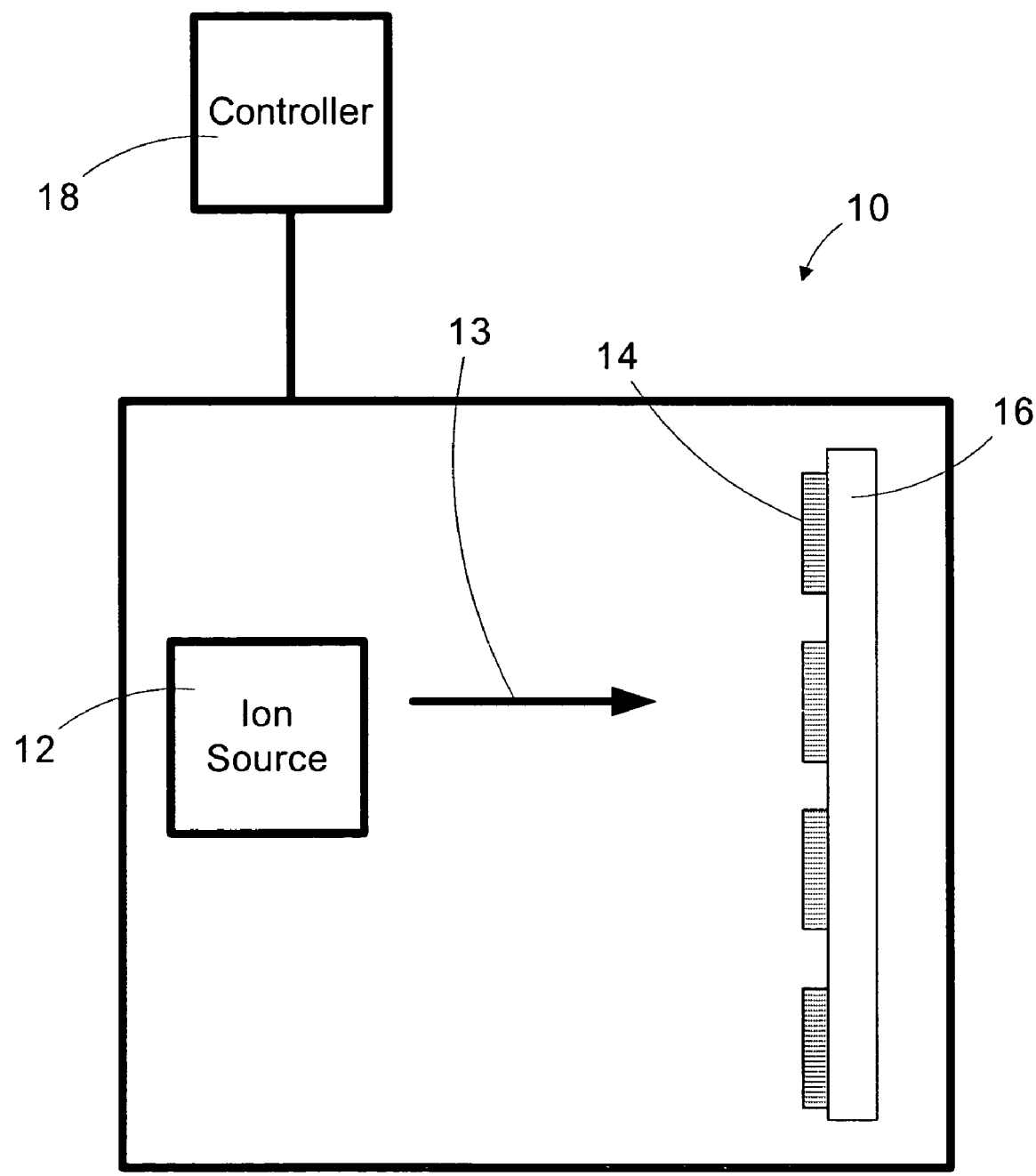
FIG. 1 is a simplified, block diagram description of an illustrative system in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various systems and methods for fault detection and control of ion implantation processes and tools. As will be readily apparent to those skilled in the art upon a complete reading of the present application, the present method is applicable to the performance of ion implantation processes using a variety of different types of ion implant tools, and to the implantation of a variety of different dopant materials, e.g., N-type and P-type dopant materials. Moreover, the present invention may be used in the context of forming a variety of devices, including, but not limited to, logic devices, memory devices, etc. The present invention may be employed with ion implant tools where multiple or single wafers are subjected to an ion implant process.

FIG. 1 is a simplified, block diagram of an illustrative ion implant tool 10 that may be employed in accordance with one aspect of the present invention. The ion implant tool 10 is intended to be illustrative in nature in that it is representative of any of a variety of commercially available ion implant tools. For example, in one illustrative embodiment, the ion implant tool 10 is a Model VIISion 80 manufactured by Varian. The tool 10 is comprised of a schematically depicted ion source 12 that is used to generate ions, as indicated by the arrow 13, that are implanted into a plurality of substrates 14 positioned in the tool 10. The substrates 14 are held in place within the tool 10 by a substrate holder 16. The substrate holder 16 may, in some cases, hold single or multiple wafers, i.e., serial or batch processing configurations. Of course, as will be understood by those skilled in the art, a typical ion implant tool 10 is a very complex piece of equipment that contains many components not depicted in FIG. 1 so as not to obscure the present invention. U.S. Pat. No. 6,055,460 depicts one illustrative embodiment of an ion implant tool that may be used in accordance with the present invention. U.S. Pat. No. 6,055,460 is hereby incorporated by reference in its entirety. As will be appreciated by those skilled in the relevant art, the tool 10 depicted in FIG. 1 is schematic in nature. Thus, the relative positioning of the substrates 14 and the ion source 12 is provided by way of example only. Moreover, the tool 10 may contain means for moving the substrates 14 while the implantation process is being performed. Thus, the particular configuration of the schematically depicted ion implant tool 10 should not be considered a limitation of the present invention. It should also be noted that the present invention may also be employed with implant tools 10 that process only a single substrate 14 at a time.

A controller 18 may be operatively coupled to the ion implant tool 10 and it may be any type of device capable of executing instructions. In some embodiments, the controller 18 may be a microprocessor or a computer. The controller 18 may be resident on the ion implant tool 10, it may be a stand-alone device, or it may be part of an overall computer system that is adapted to control one or more aspects of the operations performed in an integrated circuit manufacturing facility. The controller 18 may be employed to perform various functions described herein. The functions performed by the controller 18 may be performed by multiple computing resources.

The substrates 14 depicted in FIG. 1 are also intended to be representative in nature as the present invention may be employed in the context of implanting ions into substrates 14 comprised of a variety of different materials, e.g., silicon, silicon-on-insulator (SOI) structures, III-V materials, etc. The present invention may also be employed in the context of implanting dopant material into a previously formed layer of material. Moreover, the present invention may be employed when implanting a variety of different types of dopant materials, e.g., N-type dopant materials, such as phosphorous (P) or arsenic (As), or P-type dopant materials, such as boron (B) or boron difluoride ($BF_2$). Thus, the present invention should not be considered as limited to the implantation of any particular type of dopant materials unless such limitations are clearly set forth in the appended claims.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary information exchange and process control framework suitable for use in such a manufacturing system is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

As indicated in the background section of the application, ion implant tools are typically automatically "tuned" before the actual ion implant process is performed or periodically tuned. The purpose of the automatic tuning process is to select a variety of different parameters or settings, e.g., beam current, tilt angle, twist angle, number of scans, dose, filament current, etc., that will be used when the ion implant process is actually performed. Given the number of parameters involved, there are a vary large number of possible combinations of tool parameters. Moreover, different combinations of tool parameters may be used to perform the same desired implant recipe. After the ion implant tool is "tuned," the ion implant process is performed on substrates positioned in the ion implant tool. However, given the large number of parameters and the relatively large range of values those parameters may have, performing meaningful fault detection may be difficult. For example, excessive faults may occur due to the fact that the tool parameters resulting from the tuning process may have many different values, sometimes with large differences between such values, depending upon how the automatic tuning process is performed. What is desired is a fault detection methodology wherein relatively tight control of the ion implant process may be achieved without excessive fault detection.

Generally, the success or failure of the ion implant process is not determined until well after the implant process has been completed and the substrates have been removed from the ion implant tool. The acceptability of the ion implant process may be determined by a variety of tests, e.g., electrical tests, visual inspection, etc., some of which are destructive in nature. Unfortunately, such evaluation processes can take a long time and involve consumption of scarce metrology resources and personnel. Thus, the feedback from such processes is not as timely as is desired. Moreover, the "tuned" ion implant tool may have processed additional substrates prior to receiving feedback as to the acceptability of the ion implant process. If the testing leads to the conclusion that the implant regions resulting from the ion implant process are unacceptable, then the substrates are normally destroyed. That is, ion implant processes that do not result in the formation of acceptable implant regions in the substrate are very wasteful and adversely impact manufacturing efficiencies and product yield.

Figure 2:
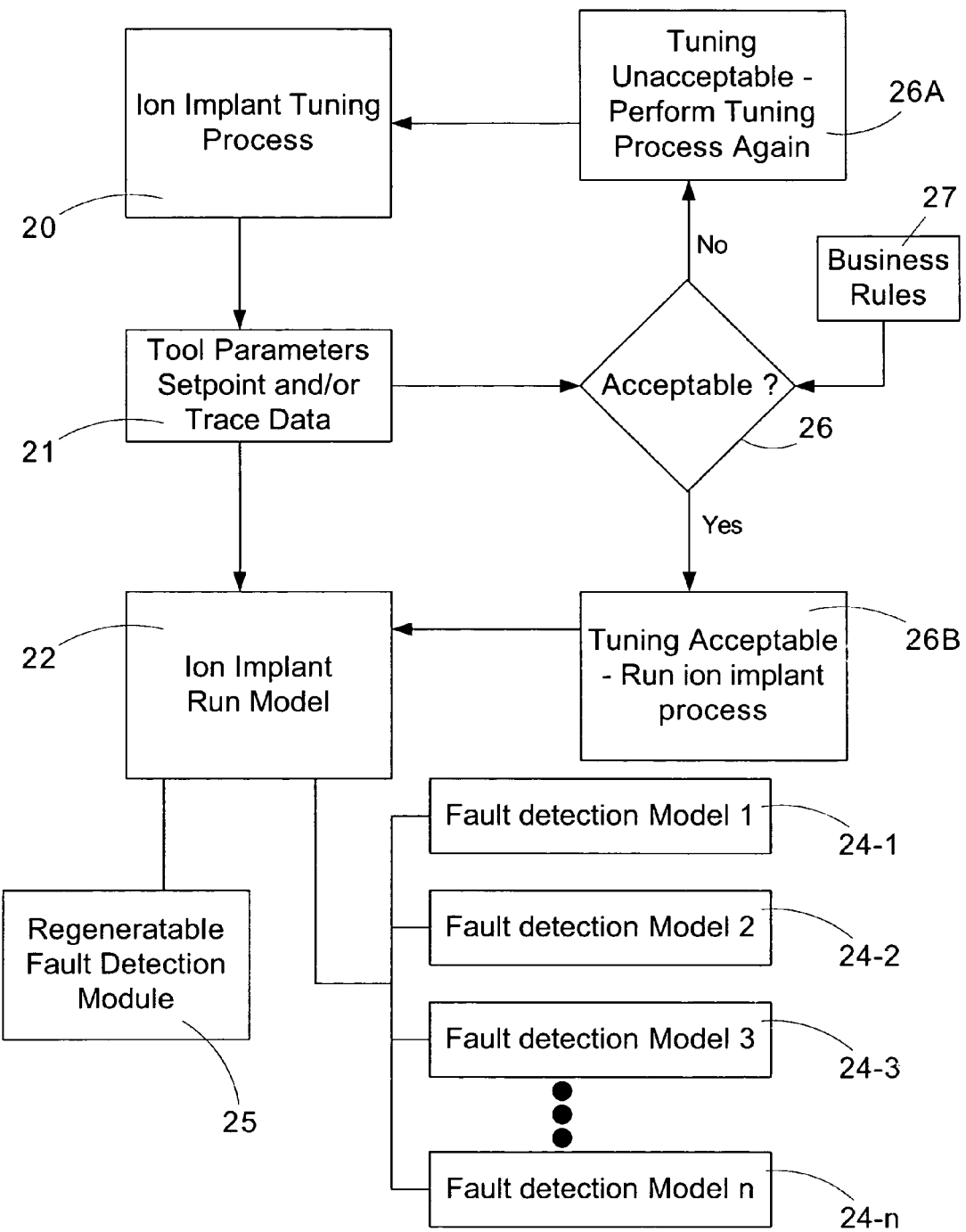
FIG. 2 is a simplified, block diagram explaining various illustrative methodologies in accordance with the present invention.

To solve or reduce one or more of the foregoing problems, the present invention employs various models and control routines in connection with the operation of an ion implant tool. In one illustrative embodiment, as shown in FIG. 2, the present invention uses the results from the ion implant tuning process 20 and an ion implant run model 22. In some cases, the run model 22 may have access to one or more fault detection models (FDM) 24-1–24-n or to a regeneratable fault detection model 25. As set forth herein, the present invention may involve the creation of one or more multi-variant or single-variant models for the purposes described herein. A variety of techniques known to those skilled in the art may be used to create the models described herein. For example, the models created herein may be created, revised and updated using a ModelWare® software package sold by Triant Technologies, Inc. of Nanaimo, British Columbia, Canada. The models described herein may be developed empirically using commonly known linear or non-linear techniques. The model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected.

Initially, a request is made for the implant tool 10 to perform an implant process to form implant regions in accordance with a certain recipe, e.g., a certain dopant species, e.g., arsenic, boron, etc., dopant concentration and depth. Based upon such a request, the tuning process 20 is performed by the ion implant tool 10 in an effort to produce a combination of setpoints for various tool parameters, and/or trace data, as indicated in block 21, that will result in the doped regions having the desired dopant profile and concentration. In one embodiment, the tuning process 20 is accomplished by software resident on the ion implant tool 10. The tool setpoint parameters resulting from the tuning process 20 may include a variety of parameters, such as beam current, twist angle, or any of the other tool parameters identified previously. The trace data may also be related to a variety of parameters, provided from a variety of internal or external sensors and/or inputs that reflect various aspects of the ion implant tool 10 and/or the conditions under which the ion implant process will be performed. For example, such trace data may include pressure, temperature, tool state data, the maintenance history of the tool, accelerator voltage, accelerator current, suppressor voltage, suppressor current, source pressure, filament voltage, filament current, spin speed for substrate holders, etc.

During the tuning process 20, the controller 18 may go through many possible tool parameter combinations until it arrives at a combination of tool parameters that are believed to be sufficient to produce the desired uniformity of beam densities. That is, the controller 18 will attempt to tune or adjust various tool parameters associated with the ion implant process in an effort to insure that the ion beam is relatively stable and capable of producing the desired results. There are many related tool parameters that impact the performance of the ion implant tool 10. Such factors include, but are not limited to, the implant dose, the implant energy level, beam current, tilt or twist angle, arc current, arc voltage, filament current, filament voltage, gas flow rates, magnet current, extraction current, extraction voltage, suppression current, suppression voltage, etc. Many varied combinations of these parameters may result from the tuning process 20.

As a specific example, the tuning process 20 may generate values that range from 8–12 mA for the beam current and 23–27 degrees for the twist angle. A different range of values may be generated for other tool parameters, e.g., extraction current, etc. A collection of values for one or more of the tool parameters resulting from the tuning process 20 is schematically depicted at block 21 in FIG. 2. In one illustrative embodiment, the tool parameters 21 resulting from the tuning process 20 are averaged to arrive at a collection of averaged tool parameters. That is, during the tuning process 20, the values for a given variable, e.g., beam current, tilt or twist angle, may have ten different values depending upon the value selected for other tool parameters. After the tuning process 20 is completed, the various values for each parameter may be averaged.

In one aspect, the present invention may be employed to determine the acceptability of the tuning process 20. This is indicated by the decision point 26 depicted in FIG. 2. One input to the decision point may be a variety of business rules, as indicated at block 27. In general, the business rules may be a variety of different factors that are considered for purposes of determining the acceptability of the tuning process 20. For example, the business rules may consider how long it will take to perform the ion implant process using the tool parameters resulting from the tuning process. That is, in one illustrative example, based upon the number of scans that will be performed using the parameters generated by the tuning process 20, the resulting ion implant process may take too long to perform. Another example of a business rule that might be considered is the age and/or condition of one or more components of the ion implant tool 22. For example, the tuning process 20 may result in setpoints for various tool parameters whereby a component, e.g., the filament, is expected to perform it function at a relatively high current or voltage. Based on information regarding the prior use of this filament, e.g., previous number of hours used, it may be evident that the existing filament in the ion implant tool 10 cannot perform the ion implant process using the parameters resulting from the tuning process 20. If the tool setpoint parameters 21 from the tuning process 20 are deemed to be unacceptable, then the results of the tuning process 20 are rejected and the ion implant tool 10 is retuned, as indicated at block 26A. If the tool setpoint parameters 21 from the tuning process 20 are acceptable, then the ion implant process may be performed using the tool setpoint parameters 21 resulting from the tuning process 20, as indicated at block 26B. Additionally, in some embodiments, if the tool setpoints parameters 21 are deemed to be acceptable, the ion implant model 22 may be used to determine or select a fault detection model for the ion implant process, as described more fully below.

The acceptability of the tool setpoint parameters 21 produced by the tuning process 20 may be determined by a variety of techniques. In one illustrative embodiment, the setpoint parameters in block 21 may be used to generate a confidence level, e.g., a single confidence number or range of numbers, that reflects the confidence that parameters 21 resulting from the tuning process (averaged or otherwise) will produce acceptable results in terms of producing acceptable implant regions, reducing process time, etc.

For example, to arrive at a confidence level, the tool setpoint parameters 21 resulting from the tuning process will be compared to reference data, which is a collection of one or more tool parameters that, based on historical wafer metrology data, are believed to produce implant regions having the desired concentration and/or dopant profile. This reference data may be determined based on various metrology and/or electrical tests performed on one or more production or test substrates processed through the ion implant tool 10. For example, after substrates have been run in the implant tool 10, the tool setpoint parameters actually employed during the ion implant process and/or trace data regarding the ion implant process may be recorded and associated with the substrates subjected to the ion implant process by substrate or lot number. Thereafter, one or more metrology or electrical tests, some of which may be destructive, are performed to determine the acceptability of the implant regions produced in the implant tool 10. Such testing may not be done until well after the ion implant process has been performed. For example, such electrical testing may be part of standard wafer electrical testing (WET) performed after one or more layers of metallization are formed above the device.

This reference data, i.e., the collection of historical metrology data and associated tool parameters, may be stored in a database that may be accessed by the controller 18. A level of confidence may also be associated with this historical data. When the controller 18 is provided with the tool setpoint parameters 21 resulting from the tuning process 20, the collection of historical metrology data and associated tool parameters may be accessed. The tool setpoint parameters 21 resulting from the tuning process 20 may be matched with one or more of the entries in the historical data collection using a variety of known matching techniques. If the matched entry from the database resulted in acceptable implant regions, as determined by the associated metrology data, then the ion implant process may be performed using the setpoint parameters 21 resulting from the tuning process 20. The results from the comparison of the tool parameters 21 resulting from the tuning process 20 with the historical collection of data may be a confidence level or a simple GO/NO GO instruction.

Over time, this procedure should result in a value, or a range of values, i.e., reference data, for the various tool setpoint parameters (or combinations thereof) that have historically produced acceptable implant regions, e.g., implant regions exhibiting the desired dopant concentration and dopant profile. For example, such a procedure may lead to the conclusion that as long as one or more parameters, e.g., beam current, stays within a range of 8–12 mA, acceptable implant regions are produced. This analysis may be applied with respect to any number of parameters or any combination of such parameters, i.e., a multi-variant analysis. Alternatively, in lieu of generating a confidence level, the tool parameters 21 produced by the tuning process 20 may be directly compared to tuning parameters associated with the historical metrology data to determine if the tool parameters 21 are likely to produce acceptable results.

Once the correlation is established between the tool setpoint parameters of the ion implant tool 10 and the metrology data for substrates processed in the tool 10, the controller 18 may be used to control the ion implant process. For example, the controller 18 may be used to insure that, based upon the metrology data, only parameter combinations from the tuning process 20, e.g., tool setpoint parameters 21, that have a high probability of producing acceptable implant regions are performed. For example, based upon the metrology data, it may be determined that when a given parameter, e.g., beam current, arc voltage, gas flow rate, etc., exceeds a set value, ion implant regions of unacceptable quality are produced. Accordingly, the controller 18 would, in that situation, prevent the ion implant tool 10 from performing an implant process using such parameters. As another example, analysis of the metrology data and the tool parameters may result in a correlation whereby as long as one or more tool parameters (or combinations thereof) are maintained within a preselected range, then acceptable implant regions are likely to result. The present invention may be employed in situations where the parameter(s) from the tuning process 20 may fall below a maximum value, above a minimum value, within a range of values, or outside of a range of values. This methodology may also be employed to establish a confidence level (or range) for a given combination of tool parameters 21 that result from the tuning process 20.

In a first aspect of the present invention, the parameters 21 from the tuning process 20 may be compared to the reference data to determine if the ion implant process should be performed or not. A very simple example will be provided to explain this aspect of the present invention. The reference data may reflect that acceptable implant regions are formed when the beam current is within a range of 10–12 mA. Assume that the average beam current parameter 21 predicted by the tuning process 20 is in one case 3 mA, in another case 7 mA, and in another case 9 mA. Comparing these values to the reference data for beam currents, the first setting (3 mA) would have the lowest level of confidence, the second setting (7 mA) would have an intermediate level of confidence, and the third setting (9 mA) would have the highest level of confidence in the simple example provided above. Such confidence levels may be established by a variety of known techniques. For example, variations may be assigned differing levels of confidence based on standard deviations from the mean parameter values identified above. Thus, the manner in which the level of confidence is established with respect to the parameters resulting from the set-up model should not be considered a limitation unless such limitations are expressly set forth in the appended claims.

Any type of metrology tool that is useful in determining any aspect of the implant regions formed in a substrate or the ion implant process itself may be used to create this historical metrology data. For example, such a metrology tool may measure or assist in determining the depth of the implant region, the dopant concentration profile, the surface area occupied by an implant region, the resistivity of an implant region, the species implanted, ion mobility, etc. In one illustrative embodiment, the metrology tool may be the Prometrix tools identified previously.

In another aspect, the present invention may establish various requirements, e.g., business rules, to determine the acceptability of the tool setpoint parameters 21 resulting from the tuning process 20. Such requirements may not directly relate to the ability of the tool 10 to produce acceptable implant regions. For example, given the relatively long duration of the implant process, a business rule may be established that the implant tool 10 must perform the implant process within a maximum number of scans. For example, if the tuning process 20 produces tool setpoint parameters 21 that require the number of scans exceed the maximum allowable number, the controller 18 may reject the parameters 21 produced by the tuning process and instruct that the tuning process may be performed again. In this aspect, the present invention may be employed to increase manufacturing efficiencies while still producing implant regions of an acceptable quality.

In another aspect of the present invention, the ion implant run model 22 may be used to select one of a number of previously created fault detection models (FDM) 24-1–24-n, as indicated in FIG. 2. For ease of reference, the fault detection models (FDM) may be referred to individually and collectively by the reference number 24. The selection of the particular fault detection model is based upon a comparison of the parameters 21 from the tuning process 20 and corresponding parameters in each of the fault detection models 24. The fault detection models 24 may be stored in or accessible by the implant run model 22, i.e., such models 24 may be stored in a database. In this aspect of the present invention, the fault detection model 24 that best approximates or matches the parameters 21 from the tuning process 20 is selected as the fault detection model 24 for monitoring the ion implant process to be performed in the implant tool 10 using the tool parameters 21 resulting from the tuning process 20. The selected fault detection model 24 will have values or ranges of values for some, if not all, of the tool parameters 21.

Another simplified example will be provided to explain one illustrative aspect of the present invention. Assume that the tuning process 20 indicates that the beam current for the ion implant tool 10 should be 9.5 mA. Of course, the output from the tuning process 20 could be, as stated before, a range of values or an average value for the parameters. Based upon the value of 9.5 mA for the beam current, the ion implant model 22 may then select one of the fault detection models 24 that closely approximates or matches this identified value for the beam current. For example, the ranges for beam current value for the fault detection models 24-1, 24-2 and 24-3 may be 6–8 mA, 10–12 mA and 14–18 mA, respectively. Based on the beam current value of 9.5 mA selected by the tuning process 20, the ion implant run model 22 may select fault detection model 24-2, as it is the fault detection model with the closest value for the beam current of 9.5 mA selected by the tuning process. In this simplified example, only a single variable has been examined. In practice, selecting the appropriate fault detection model (FDM) 24 may involve a multi-variant analysis.

As set forth above, the selected fault detection model, e.g., 24-2, is then used to monitor the process in the ion implant tool 10 as it is performed using the tool parameters 21 resulting from the tuning process 20. Of course, the fault detection models 24-1–24-n may be segregated based upon a combination of tool parameters, e.g., beam current, tilt or twist angle, filament current, etc. The model 24 that best fits the tool parameters 21 resulting from the tuning process 20 may be determined by a variety of known statistical techniques, e.g., interpolation, etc. In some cases, the models 24-1–24-n may also encompass variables other than tool parameters used in the ion implant process. For example, the models 24-1–24-n may also include a variable directed to the state of the tool 10, such as the number of processing hours (or range of hours) since maintenance procedures were last performed on the tool 10.

In this manner, better control and fault detection capabilities may be realized with respect to the operation of the ion implant tool 10. By selecting the fault detection model 24 based upon the parameters 21 resulting from the tuning process, tighter process control may be achieved. That is, fault detection methodologies may be employed based upon fault detection models (FDM) that are more reflective of the tool parameters that will actually be employed in performing the ion implant process in the ion implant tool 10. Using this methodology, tighter process control may be achieved by employing fault detection models that minimize the allowable magnitude of variations in one or more parameters.

As the implant process is being performed, or after it is completed, trace data may be collected with respect to values, or range of values, for various tool parameters. This obtained trace data may then be compared to the values for corresponding parameters in the selected fault detection model 24, e.g., 24-2. If there is a variance between a measured value of a parameter, e.g., beam current, twist angle, and a value (or range of values) for that parameter in the selected fault detection model 24-2, a fault condition may be indicated or identified. In some cases, the fault may be indicated only if the measured parameter exceeds the value for the parameter in the selected fault detection model by a preselected amount.

Once a fault condition is identified, various actions may be taken. Initially, the substrate processed in the ion implant tool may be identified as being a suspect group of substrates, i.e., a group where the ion implant process did not proceed in accordance with the values predicted by the selected fault detection model, e.g., model 24-2. In another embodiment, the processed substrates may be immediately identified as scrap. In yet another aspect, the identification of a fault may lead one to stop using the particular ion implant tool 10 until such time as maintenance personnel may inspect the tool. As another example, the identification of a fault may notify the maintenance department that the particular ion implant tool should be serviced as soon as possible.

In another aspect of the present invention, the system may employ a generic, regeneratable fault detection model 25 (see FIG. 2) that may be regenerated in lieu of or in addition to the plurality of fault detection models 24-1–24-n that may be stored in a database. In this case, the ion implant run model 22 may generate a unique fault detection model 25 for the tool parameters 21 resulting from the tuning process 20. That is, the ion implant run model 22 may be used to create or generate a specific fault detection model that is tailored to the collection of tool parameters 21 resulting from the tuning process 20. As before, using this technique, fault detection methodologies for the ion implant tool 10 may be improved due to the use of the regenerated fault detection model that is specifically tailored to the tool parameters about to be performed in the ion implant tool 10.

Figure 3:
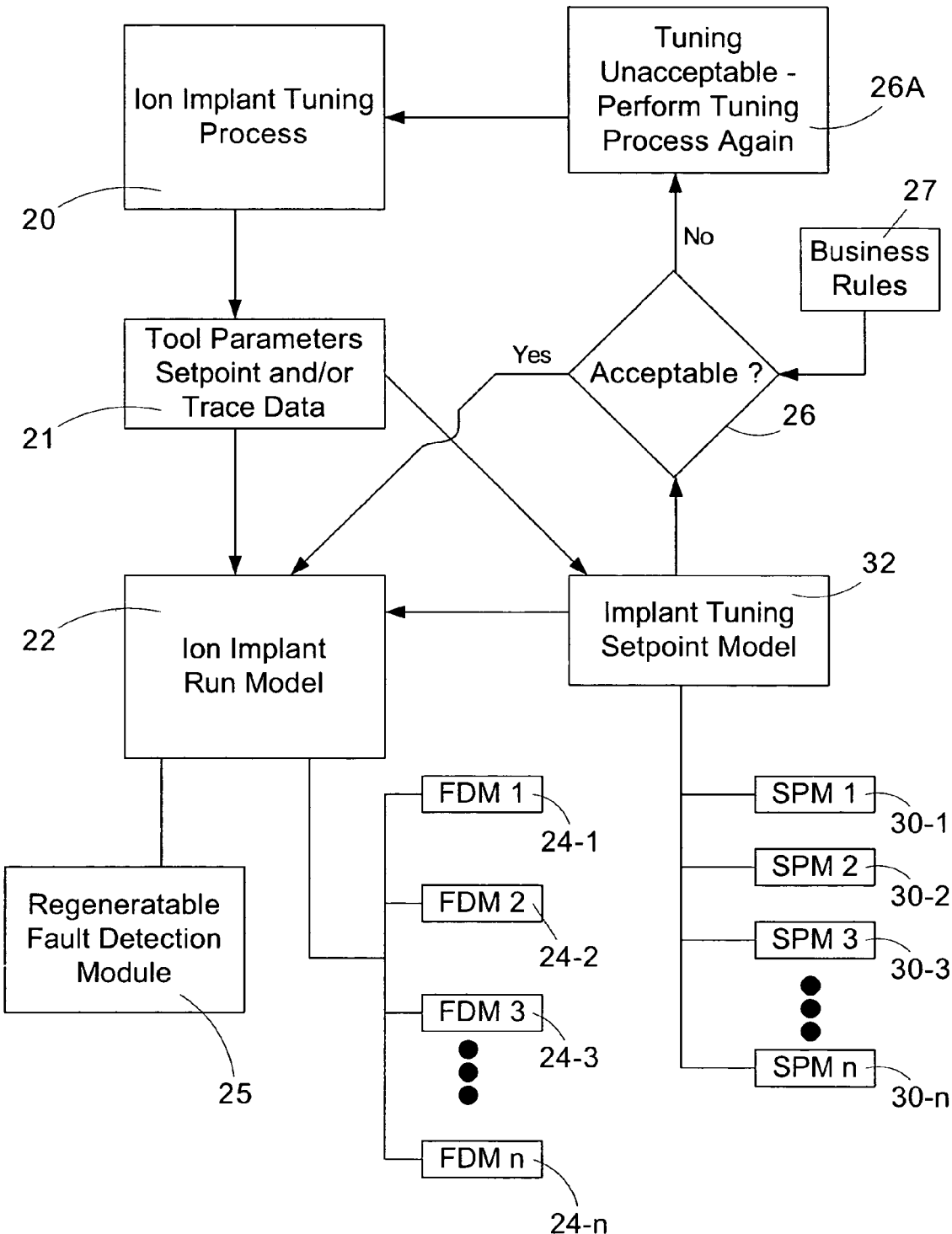
FIG. 3 is a simplified, block diagram explaining other illustrative methodologies in accordance with another aspect of the present invention.

FIG. 3 depicts alternative methodologies that may be employed in accordance with the present invention. In this embodiment, a plurality of implant tuning setpoint models (SPM) 30 (1-$n$) may be used as part of the process of determining the acceptability of the tuning process 20. For ease of reference, setpoint models (SPM) may be individually and/or collectively referenced by the number 30. In this embodiment, the tool setpoint parameters and/or trace data, as indicated at block 21, may be provided to an implant tuning setpoint model 32. In turn, the implant tuning setpoint model 32 may try to match the tool setpoint data 21 (from the tuning process 20) with one or more of a collection of previously established setpoint models (SPM) 30-1, 30-2, 30-3, . . . 30-$n$. The setpoint models (SPM) 30 may be established based upon historical metrology data and/or confidence levels that are based upon historical performance data. For example, in one example, the tool setpoint parameters 21 resulting from the tuning process 20 may not match any of the setpoint models 30. That situation may be indicative of an abnormal situation in that the tuning process 20 is suggesting tool parameters 21 that do not match any of the tool setpoint models (SPM) 30, even though such models may be based upon a great deal of historical data. Such a situation may lead to a rejection of the tool parameters 21 from the tuning process 20 because the results of the tuning process 20 vary greatly from previously established norms. In another example, the product that is to be manufactured may be a high performance integrated circuit device, e.g., a high performance microprocessor. In that situation, the historical data may indicate that only two or three of the collection of setpoint models (SPM) 30 produce acceptable results. In that case, if the tool setpoint parameters 21 from the tuning process 20 do not match one of those two or three setpoint models (SPM) 30, then the tuning process 20 may be rejected. Simply put, in this embodiment, the setpoint models 30 may be used as at least one factor in determining the acceptability of the tuning process 20. Of course, as indicated in FIG. 3, a variety of business rules 27 may also be employed in the decision-making process, as described above. If the results are acceptable based upon the additional input provided by consideration of the setpoint models (SPM) 30, then the ion implant process may be performed, and a fault detection model (FDM) may be selected as described above.

In one illustrative embodiment, the method comprises performing a tuning process for an ion implant tool, the tuning process resulting in at least one tool parameter for the ion implant tool, selecting a fault detection model for an ion implant process to be performed in the ion implant tool based upon the tool parameter resulting from the tuning process, and monitoring an ion implant process performed in the ion implant tool using the selected fault detection model.

In another illustrative embodiment, the method comprises performing a tuning process for an ion implant tool, the tuning process resulting in at least one tool parameter for the ion implant tool, creating a fault detection model for an ion implant process to be performed in the ion implant tool based upon the tool parameter resulting from the tuning process, and monitoring an ion implant process performed in the ion implant tool using the created fault detection model.

In yet another illustrative embodiment, the method comprises performing a tuning process for an ion implant tool, the tuning process resulting in at least one tool parameter for the ion implant tool, and determining if the tool parameter resulting from the tuning process is acceptable based on historical metrology data for implant regions formed in at least one substrate subjected to an ion implant process performed in the ion implant tool.

In a further illustrative embodiment, the method comprises performing a tuning process for an ion implant tool, the tuning process resulting in at least one tool parameter for the ion implant tool, and determining if the tool parameter resulting from the tuning process is acceptable based on a comparison of the tool parameter with a collection of tuning setpoint models.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
performing a tuning process for an ion implant tool, said tuning process resulting in at least one tool parameter for said ion implant tool;
selecting a fault detection model for an ion implant process to be performed in said ion implant tool based upon said at least one tool parameter resulting from said tuning process; and
monitoring an ion implant process performed in said ion implant tool using said selected fault detection model.

2. The method of claim 1, wherein said tuning process is performed in said ion implant tool.

3. The method of claim 1, wherein said tuning process is performed when a new ion implant recipe is to be performed in said ion implant tool.

4. The method of claim 1, wherein said tuning process results in a plurality of tool parameters for said ion implant tool.

5. The method of claim 1, wherein said selected fault detection model is selected from a plurality of pre-existing fault detection models.

6. The method of claim 1, wherein said selected fault detection model is selected from a plurality of fault detection models based upon a comparison of said at least one tool parameter resulting from said tuning process and a corresponding tool parameter in one of said plurality of fault detection models.

7. The method of claim 1, wherein said at least one tool parameter is comprised of at least one of an implant dose, an implant energy level, a beam current, a twist angle, an arc current, an arc voltage, a filament current, a filament voltage, a gas flow rate, a magnet current, an extraction current, an extraction voltage, a suppression current and a suppression voltage.

8. The method of claim 1, further comprising:
monitoring at least one tool parameter during said ion implant process; and declaring a fault condition when said monitored at least one tool parameter does not fall within preselected allowable limits established by said selected fault detection model.

9. A method, comprising:
performing a tuning process for an ion implant tool, said tuning process resulting in at least one tool parameter for said ion implant tool;
creating a fault detection model for an ion implant process to be performed in said ion implant tool based upon said at least one tool parameter resulting from said tuning process; and
monitoring an ion implant process performed in said ion implant tool using said created fault detection model.

10. The method of claim 9, wherein said tuning process is performed in said ion implant tool.

11. The method of claim 9, wherein said tuning process is performed when a new ion implant recipe is to be performed in said ion implant tool.

12. The method of claim 9, wherein said tuning process results in a plurality of tool parameters for said ion implant tool.

13. The method of claim 9, wherein said at least one tool parameter is comprised of at least one of an implant dose, an implant energy level, a beam current, a twist angle, an arc current, an arc voltage, a filament current, a filament voltage, a gas flow rate, a magnet current, an extraction current, an extraction voltage, a suppression current and a suppression voltage.

14. The method of claim 9, further comprising:
monitoring at least one tool parameter during said ion implant process; and
declaring a fault condition when said monitored at least one tool parameter does not fall within preselected allowable limits established by said created fault detection model.

15. A method, comprising:
performing a tuning process for an ion implant tool, said tuning process resulting in at least one tool parameter for said ion implant tool; and
determining if said at least one tool parameter resulting from said tuning process is acceptable based on historical metrology data for implant regions formed in at least one substrate subjected to an ion implant process performed in said ion implant tool.

16. The method of claim 15, further comprising performing an ion implant process in said tool using said at least one tool parameter resulting from said tuning process if said at least one tool parameter is determined to be acceptable.

17. The method of claim 15, further comprising performing another tuning process for said ion implant tool if said at least one tool parameter is determined to be unacceptable.

18. The method of claim 15, wherein said step of determining if said at least one tool parameter is acceptable is based upon a confidence value associated with said at least one tool parameter.

19. The method of claim 15, wherein said step of determining if said at least one tool parameter is acceptable is based upon a comparison of said at least one tool parameter resulting from said tuning process and a corresponding tool parameter associated with said historical metrology data.

20. The method of claim 15, wherein said metrology data comprises at least one of a dopant concentration, a depth of a doped region and a dopant concentration profile.

21. The method of claim 15, wherein said at least one tool parameter is comprised of at least one of an implant dose, an implant energy level, a beam current, a twist angle, an arc current, an arc voltage, a filament current, a filament voltage, a gas flow rate, a magnet current, an extraction current, an extraction voltage, a suppression current and a suppression voltage.

22. The method of claim 15, wherein said tuning process is performed in said ion implant tool.

23. The method of claim 15, wherein said tuning process is performed when a new ion implant recipe is to be performed in said ion implant tool.

24. The method of claim 15, wherein said tuning process results in a plurality of tool parameters for said ion implant tool.

25. The method of claim 15, further comprising, if said at least one tool parameter is determined to be acceptable, selecting a fault detection model for an ion implant process to be performed in said ion implant tool based upon said at least one tool parameter resulting from said tuning process.

26. The method of claim 25, further comprising monitoring an ion implant process performed in said ion implant tool using said selected fault detection model.

27. The method of claim 15, further comprising, if said at least one tool parameter is determined to be acceptable, creating a fault detection model for an ion implant process to be performed in said ion implant tool based upon said at least one tool parameter resulting from said tuning process.

28. The method of claim 27, further comprising monitoring an ion implant process performed in said ion implant tool using said created fault detection model.

29. The method of claim 15, further comprising determining if said at least one tool parameter resulting from said tuning process is acceptable based upon at least one business rule.

30. A method, comprising:
performing a tuning process for an ion implant tool, said tuning process resulting in at least one tool parameter for said ion implant tool; and
determining if said at least one tool parameter resulting from said tuning process is acceptable based on a comparison of said at least one tool parameter with a collection of tuning setpoint models.

31. The method of claim 30, further comprising performing an ion implant process in said tool using said at least one tool parameter resulting from said tuning process if said at least one tool parameter is determined to be acceptable.

32. The method of claim 30, further comprising performing another tuning process for said ion implant tool if said at least one tool parameter is determined to be unacceptable.

33. The method of claim 30, wherein determining if said at least one parameter resulting from said tuning process is acceptable comprises determining if said at least one tool parameter matches one of a selected group of said collection of tuning setpoint models.

34. The method of claim 30, wherein determining if said at least one parameter resulting from said tuning process is acceptable comprises determining if said at least one tool parameter does not match any of said models in said collection of setpoint models.

35. The method of claim 30, wherein said step of determining if said at least one tool parameter is acceptable is based upon a confidence value associated with a setpoint model from said collection of setpoint models that matches said at least one tool parameter.

36. The method of claim 30, wherein said step of determining if said at least one tool parameter is acceptable further comprises comparing said at least one tool parameter resulting from said tuning process and a corresponding tool parameter associated historical metrology data for implant regions formed in at least one substrate subjected to an ion implant process performed in said ion implant tool.

37. The method of claim 36, wherein said metrology data comprises at least one of a dopant concentration, a depth of a doped region and a dopant concentration profile.

38. The method of claim 30, wherein said at least one tool parameter is comprised of at least one of an implant dose, an implant energy level, a beam current, a twist angle, an arc current, an arc voltage, a filament current, a filament voltage, a gas flow rate, a magnet current, an extraction current, an extraction voltage, a suppression current and a suppression voltage.

39. The method of claim 30, wherein said tuning process is performed in said ion implant tool.

40. The method of claim 30, wherein said tuning process is performed when a new ion implant recipe is to be performed in said ion implant tool.

41. The method of claim 30, wherein said tuning process results in a plurality of tool parameters for said ion implant tool.

42. The method of claim 30, further comprising, if said at least one tool parameter is determined to be acceptable, selecting a fault detection model for an ion implant process to be performed in said ion implant tool based upon said at least one tool parameter resulting from said tuning process.

43. The method of claim 42, further comprising monitoring an ion implant process performed in said ion implant tool using said selected fault detection model.

44. The method of claim 30, further comprising, if said at least one tool parameter is determined to be acceptable, creating a fault detection model for an ion implant process to be performed in said ion implant tool based upon said at least one tool parameter resulting from said tuning process.

45. The method of claim 44, further comprising monitoring an ion implant process performed in said ion implant tool using said created fault detection model.

* * * * *